United States Patent
Darmawaikarta et al.

(10) Patent No.: US 11,488,918 B2
(45) Date of Patent: Nov. 1, 2022

(54) SURFACE FINISHES WITH LOW RBTV FOR FINE AND MIXED BUMP PITCH ARCHITECTURES

(71) Applicant: Intel Corporation, Santa Clara, CA (US)

(72) Inventors: Kristof Darmawaikarta, Chandler, AZ (US); Robert May, Chandler, AZ (US); Sashi Kandanur, Chandler, AZ (US); Sri Ranga Sai Boyapati, Chandler, AZ (US); Srinivas Pietambaram, Chandler, AZ (US); Steve Cho, Chandler, AZ (US); Jung Kyu Han, Chandler, AZ (US); Thomas Heaton, Mesa, AZ (US); Ali Lehaf, Chandler, AZ (US); Ravindranadh Eluri, Chandler, AZ (US); Hiroki Tanaka, Chandler, AZ (US); Aleksandar Aleksov, Chandler, AZ (US); Dilan Seneviratne, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 855 days.

(21) Appl. No.: 16/177,022

(22) Filed: Oct. 31, 2018

(65) Prior Publication Data
US 2020/0135679 A1    Apr. 30, 2020

(51) Int. Cl.
*H01L 21/00* (2006.01)
*H01L 23/00* (2006.01)
(Continued)

(52) U.S. Cl.
CPC ........ *H01L 24/17* (2013.01); *H01L 21/76877* (2013.01); *H01L 21/76897* (2013.01);
(Continued)

(58) Field of Classification Search
CPC ............... H01L 24/17; H01L 21/76877; H01L 21/76897
See application file for complete search history.

(56) References Cited

U.S. PATENT DOCUMENTS 9,972,590 B2 * 5/2018 Choi ................. H01L 23/49838
10,224,300 B2 * 3/2019 Hu .......................... H01L 24/06
(Continued)

FOREIGN PATENT DOCUMENTS

| DE | 102014112407 A1 * | 11/2015 | ......... H01L 21/0214 |
| WO | WO-2007004658 A1 * | 1/2007 | ........... B23K 3/0623 |
| WO | WO-2019139625 A1 * | 7/2019 | ......... H01L 21/4853 |

*Primary Examiner* — Laura M Menz
(74) *Attorney, Agent, or Firm* — Schwabe, Williamson & Wyatt, P.C.

(57) ABSTRACT

Embodiments described herein include electronic packages and methods of forming such packages. An electronic package includes a package substrate, first conductive pads formed over the package substrate, where the first conductive pads have a first surface area, and second conductive pads over the package substrate, where the second conductive pads have a second surface area greater than the first surface area. The electronic package also includes a solder resist layer over the first and second conductive pads, and a plurality of solder resist openings that expose one of the first or second conductive pads. The solder resist openings of the electronic package may include conductive material that is substantially coplanar with a top surface of the solder resist layer. The electronic package further includes solder bumps over the conductive material in the solder resist openings, where the solder bumps have a low bump thickness variation (BTV).

15 Claims, 13 Drawing Sheets

(51) Int. Cl.
*H01L 23/522* (2006.01)
*H01L 21/768* (2006.01)

(52) U.S. Cl.
CPC .......... *H01L 23/5226* (2013.01); *H01L 24/09* (2013.01); *H01L 24/11* (2013.01); *H01L 2924/0105* (2013.01); *H01L 2924/01029* (2013.01)

(56) References Cited

U.S. PATENT DOCUMENTS

| | | | |
|---|---|---|---|
| 10,438,882 B2 * | 10/2019 | Goh | H01L 23/49838 |
| 10,770,446 B2 * | 9/2020 | Kim | H01L 24/19 |
| 11,088,062 B2 * | 8/2021 | Feng | H01L 23/13 |
| 2007/0086147 A1 * | 4/2007 | Kawamura | H05K 3/3452 |
| | | | 257/E23.179 |
| 2009/0250814 A1 * | 10/2009 | Pendse | H01L 21/563 |
| | | | 257/E21.511 |
| 2018/0040577 A1 * | 2/2018 | Hu | H01L 23/498 |
| 2019/0067178 A1 * | 2/2019 | Kang | H01L 24/05 |
| 2019/0096869 A1 * | 3/2019 | Kim | H01L 23/5389 |
| 2019/0341342 A1 * | 11/2019 | Raorane | H01L 21/4857 |
| 2019/0393143 A1 * | 12/2019 | Rosch | H01L 23/49838 |
| 2020/0035594 A1 * | 1/2020 | Pun | H01L 24/05 |
| 2020/0135679 A1 * | 4/2020 | Darmawaikarta | H01L 21/76877 |
| 2020/0286847 A1 * | 9/2020 | Liu | H01L 24/19 |
| 2021/0125932 A1 * | 4/2021 | Chavali | H01L 24/16 |
| 2022/0187548 A1 * | 6/2022 | Marin | G02F 1/09 |
| 2022/0187549 A1 * | 6/2022 | Tanaka | G02B 6/4213 |

* cited by examiner

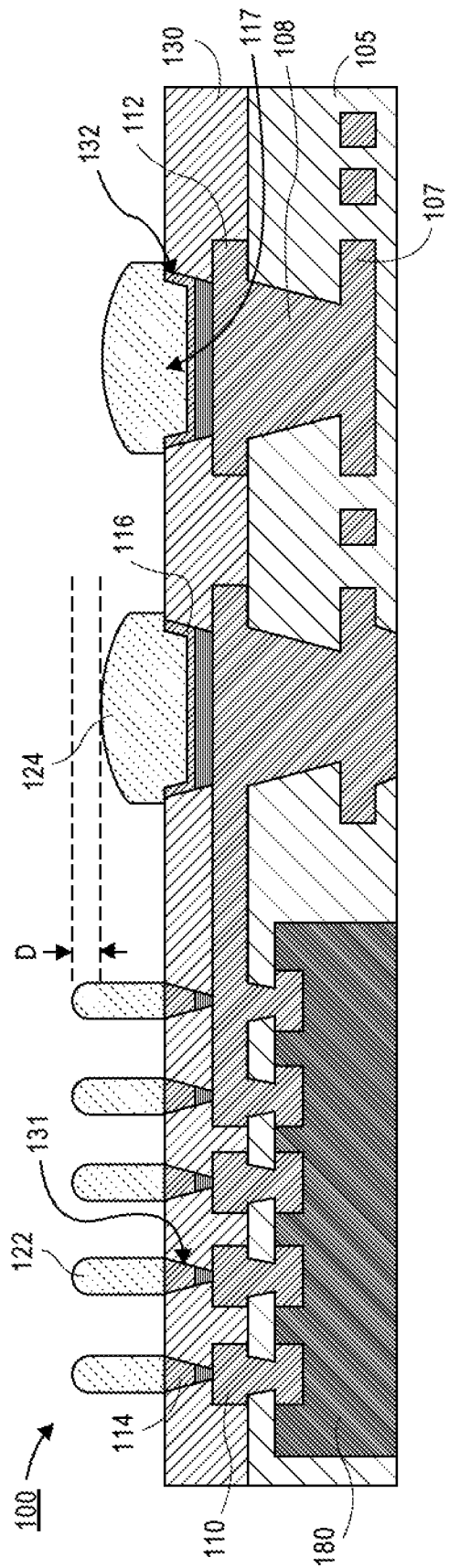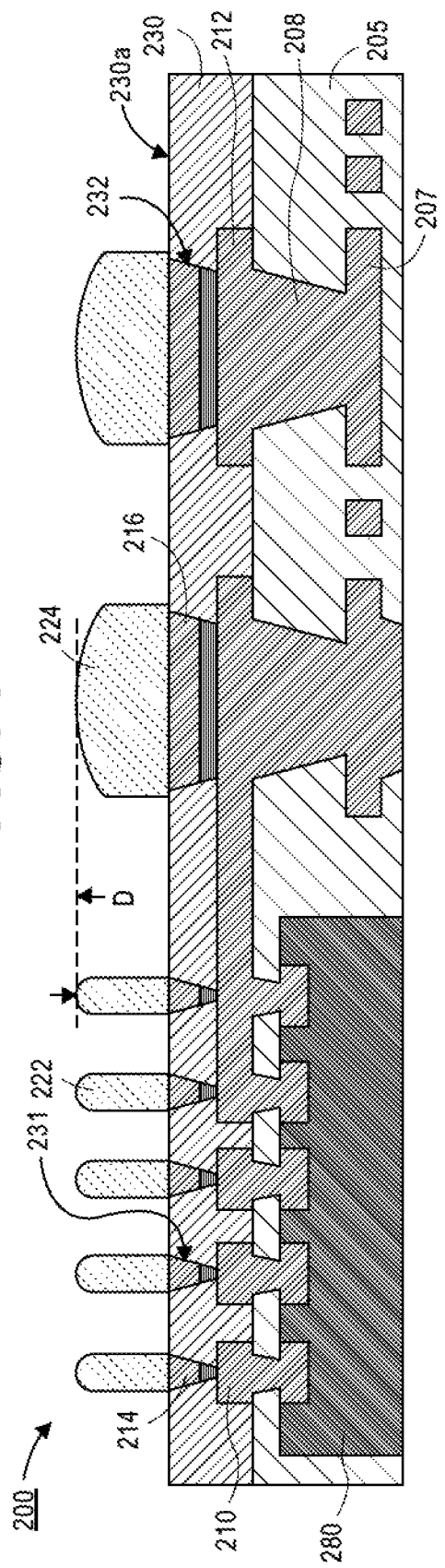

SURFACE FINISHES WITH LOW RBTV FOR FINE AND MIXED BUMP PITCH ARCHITECTURES

TECHNICAL FIELD

Embodiments of the present disclosure relate to electronic packaging, and more particularly, to electronic packages with uniform solder thicknesses over mixed bump pitch architectures.

BACKGROUND

Embedded multi-die interconnect bridges (EMIBs) have several build-up layers of alternating organic dielectric laminate and copper. The combination of these layers results in high cumulative thickness variation. High thickness variation negatively impacts the assembly process window making the C4 area bump thickness variation (BTV) specification one of the most important parameters for successful package assembly. As packages continue to scale to smaller form factors, bridge counts are projected to increase and bump pitches may shrink below 40 microns. This puts additional pressure on further reducing BTV in order to successfully assemble the packages.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

FIG. 1 is a cross-sectional illustration of an electronic package that illustrates the bump thickness variation (BTV) that arises from non-uniform pad pitches and pad dimensions.

FIG. 2 is a cross-sectional illustration of an electronic package with lithographically defined via that allows for improved BTV, in accordance with an embodiment.

DETAILED DESCRIPTION

Figure 3A:
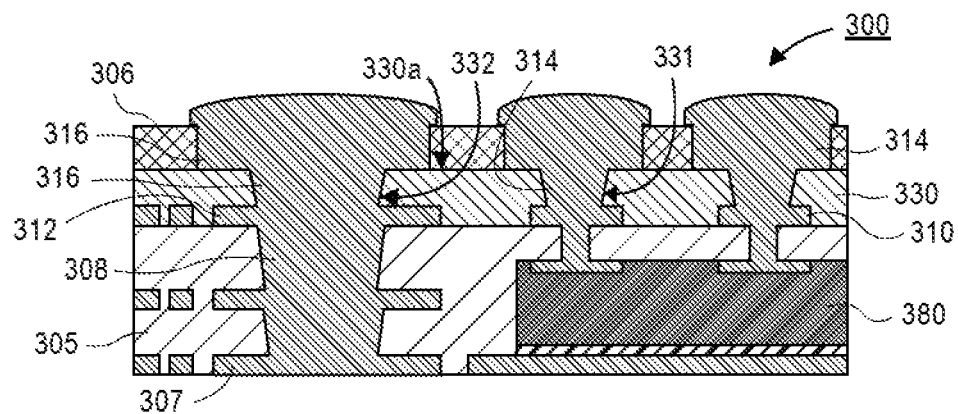
FIGS. 3A-3H are a series of cross-sectional illustrations that depict a process using lithographically defined vias to provide solder bumps with low BTV, in accordance with an embodiment.

Described herein are electronic packages with solder bumps with low bump thickness variation (BTV) and methods of forming such electronic packages. As such, some of the embodiments of the electronic packages and processes described below enable a conformal tin (Sn) fill on one or more surfaces/layers of such packages, which thereby provides a superior uniformity of a low rBTV and thus a substantially increased thermo-compression bonding (TCB) yield. In the following description, numerous specific details are set forth, such as specific material and tooling regimes, in order to provide a thorough understanding of embodiments of the present disclosure.

It will be apparent to one skilled in the art that embodiments of the present disclosure may be practiced without these specific details. In other instances, well-known features, such as integrated circuit design layouts such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

As used herein, the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Likewise, certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

These electronic devices described herein may be implemented in one or more components associated with an integrated circuit (IC) and/or between various such components. As described herein, the terms chip, integrated circuit (IC), monolithic device, semiconductor device, semiconductor package, and microelectronic device, are often used interchangeably in the semiconductor packaging field, and thus the embodiments described herein may be applicable to all of the above as known in this field.

In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in, for example, a computer.

Additionally, the embodiments described herein may be implemented further in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including an electronic device with a high bandwidth memory package architecture/process which stacks one or more next-generation high bandwidth low latency (HBLL) memory dies using redistribution layers (RDLs), through mold vias (TMVs), and/or passive silicon interposers (e.g., as shown below in FIGS. 1 and 2).

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As noted above, bump thickness variation (BTV) is an increasingly important parameter as electronic packages (e.g., embedded multi-die interconnect bridge (EMIB) packages) continue to scale to include more bridges and smaller bump pitches. For example, FIG. 1 provides a cross-sectional illustration of an electronic package 100 that includes solder bumps 122 and 124 with high BTV.

In FIG. 1, the electronic package 100 may include a package substrate 105. The package substrate 105 may comprise alternating layers of organic build-up layers and conductive (e.g., copper) routing layers 107 and vias 108, as is known in the art. In an embodiment, a bridge substrate 180 may be embedded in the package substrate 105. In an embodiment, the bridge substrate 180 may be a silicon bridge or a bridge made of any other substrate material that is suitable for forming bridges. In an embodiment, routing layers 107 and vias 108 may electrically couple first pads 110 and second pads 112 over the package substrate 105 to the bridge substrate 180 and other components and/or circuitry in the electronic package 100.

In an embodiment, a solder resist layer 130 may be formed over the package substrate 105. The solder resist layer 130 may comprise a plurality of solder resist openings 131-132 that expose the first pads 110 and second pads 112, respectively. In an embodiment, the first pads 110 may have a tighter pitch and a smaller dimension than the second pads 112. As such, in this embodiment, the solder resist openings 131 over the first pads 110 may also have a smaller diameter (or a tighter pitch and a smaller dimension) than the solder resist openings 132 over the second pads 112.

The difference in pitch and dimension of the first pads 110 and the second pads 112 results in the plating of conductive material deposited in the openings 132 to be non-uniform. For example, the conductive material 114 in the openings 131 over first pads 110 are completely filled, whereas the conductive material 116 in the openings 132 over second pads 112 does not completely fill the openings 132 since the openings are larger. That is, the conductive material 116 includes a recess 117. Since a recess 117 is formed in conductive material 116 and conductive material 114 completely fills the solder resist openings 131, the subsequently plated first solder bumps 122 and second solder bumps 124 will have a high BTV. As shown, a difference in the solder bump height D between the first solder bumps 122 formed over tightly spaced first pads 110 and the second solder bumps 124 formed over larger second pads 112 is obtained in such configurations.

Accordingly, embodiments disclosed herein include solder resist openings that are completely filled with conductive material regardless of the dimensions of the solder resist opening. As such, the solder bumps formed over the solder resist openings will have a uniform thickness even when the solder resist openings have a non-uniform pitch and/or a non-uniform dimension. These embodiments described below are thus directed to approaches/processes, structures and architectures that enable disposing a conformal Sn fill in one or more openings, surfaces, or layers in/on an electronic package. In particular, the embodiments described below provide one or more approaches to overcome the lack of via filling Sn chemistries by disposing/forming solder bumps while maintaining a low rBTV.

According to an embodiment, one approach illustrated/described below involves utilizing a Lithographic Via (LiV) process that overcomes the need for Sn filling by planarizing a laminated dielectric over one or more litho-defined copper (Cu) filled vias and forming the Sn bump over the vias using a conformal plating approach (e.g., as shown in FIGS. 3A-3H). In other embodiments, another approach illustrated/described below also overcomes the need for Sn filling by patterning a dielectric film resist (DFR) inside the solder resist opening after the seed layer formation (e.g., as shown in FIGS. 4A-4F), thus enabling a conformal Sn plating and additionally eliminating the need for one or more planarization and processing steps that may be needed in the first approach.

Some of the advantages of these embodiments include: (i) overcoming the limited chemistries of Sn via fillings used to form solder bumps, while maintaining a low rBTV; (ii) enabling superior uniformity of low rBTV and accordingly much higher TCB yield; (iii) significantly reducing processing costs by eliminating (or substantially reducing) the copper fills and/or planarization processing steps; (iv) enhancing EMIB packages that enable active die integration with TSVs, and/or also enhancing multi-die packages with a reduced thickness variation that enable high yield of large bridge die count packages and integration of low cost actives; and (v) reducing the overall z-height of the electronic packages by integrating multiple logic dies together onto such packages, and thus lowering the cost of server parts by having multiple smaller logic dies.

Additionally, some other important advantages of these embodiments include: (vi) providing a clear path to bump pitch scaling below 40 um (also reducing further die side costs); (vii) reducing thickness variation at the first-level interconnects (FLI) by improving the TCB yield and reducing the substrate rBTV yield loss; (viii) providing additional/subsequent Sn bump planarization steps that can also be included prior to reflow (e.g., a single or double planarization step(s) may be selected based on the architecture and final rBTV requirements); (viii) improving the LiV processes by establishing/meeting low rBTV, while avoiding a need for Sn fill chemistry, and also using a litho via Sn bump plating, which includes a surface finish layer step, on a LiV SR (e.g., as shown illustrated below in FIGS. 5A-5F); and (ix) enabling high speed substrate (input/output) I/O architectures by overcoming issues with the current Sn FLI bump formation shown below with FIGS. 2-6. Accordingly, a first example of such embodiments is shown in FIG. 2.

Referring now to FIG. 2, a cross-sectional illustration of an electronic package 200 with a low BTV is shown, in accordance with an embodiment. In an embodiment, the electronic package 200 may be substantially similar to the electronic package 100, with the exception that the solder resist openings 232 are entirely filled with conductive material regardless of their dimension or pitch. Whereas a recess is formed in the larger solder resist openings 132 in FIG. 1, the larger solder resist openings 232 are entirely filled in FIG. 2.

In one embodiment, the electronic package 200 may include a package substrate 205. The package substrate 205 may comprise alternating layers of organic build-up layers and conductive (e.g., copper) routing layers 207 and vias 208, as is known in the art. In an embodiment, a bridge substrate 280 may be embedded in the package substrate 105. In an embodiment, the bridge substrate 280 may be a silicon bridge or a bridge made of any other substrate material that is suitable for forming bridges. In an embodiment, routing layers 207 and vias 208 may electrically couple first pads 210 and second pads 212 over the package substrate 205 to the bridge substrate 280 and other components and/or circuitry in the electronic package 200.

In an embodiment, a solder resist layer 230 may be formed over the package substrate 205. The solder resist layer 230 may comprise a plurality of solder resist openings 231-232 that expose the first pads 210 and second pads 212, respectively. In an embodiment, the first pads 210 may have a tighter pitch and a smaller dimension than the second pads 212. As such, in this embodiment, the solder resist openings 231 over the first pads 210 may also have a smaller diameter (or a tighter pitch and a smaller dimension) than the solder resist openings 232 over the second pads 212.

In an embodiment, the solder resist openings 232 may be completely filled because the conductive material 214 and 216 is formed prior to depositing the solder resist layer 230. That is, the conductive material 214 and 216 may be formed with a lithographically defined process and the solder resist layer 230 may subsequently be deposited over and around the copper platings 214 and 216. Note that such a process will be described in greater detail below with respect to FIGS. 3A-3H.

Accordingly, as shown in FIG. 2, the top surfaces of the conductive material 214 and 216 may be substantially coplanar with a top surface 230a of the solder resist layer 230. Since the underlying conductive material 214 and 216 has a uniform thickness, subsequently deposited solder bumps 222 and 224 will have a low BTV. As illustrated and compared to FIG. 1, the first solder bumps 222 formed over tightly spaced first pads 210 and the second solder bumps 224 formed over larger second pads 212 have a substantially low difference in the solder bump height D between such configurations. For example, the BTV between the first solder bumps 222 and the second solder bumps 224 may be approximately less than 10 um. In other embodiments, the BTV between the first solder bumps 222 and the second solder bumps 224 may be approximately less than 7 um. Additionally, for other embodiments, the BTV between the first solder bumps 222 and the second solder bumps 224 may be approximately less than 7 um.

FIGS. 3A-3H are a series of cross-sectional illustrations that depict a process using lithographically defined vias to provide solder bumps with low BTV, in accordance with an embodiment. As described above, FIGS. 3A-3H illustrate one of the approaches that enable overcoming the lack of via filling Sn chemistries to form solder bumps while maintaining a low rBTV. In an embodiment, the electronic package 300 of FIGS. 3A-3H may be substantially similar to the electronic package 200 of FIG. 2. In these embodiments, the electronic package 300 may be implemented with a LiV concept used to form conformal solder bumps with a low rBTV, where a copper plating may be disposed using a conventional SAP process after the formation of the SROs.

Referring now to FIG. 3A, a cross-sectional illustration of an electronic package 300 with over-plated conductive materials 316 and 314 is shown, in accordance with an embodiment. In one embodiment, the electronic package 300 may include a package substrate 305. The package substrate 305 may comprise alternating layers of organic build-up layers and conductive (e.g., copper) routing layers 307 and vias 308, as is known in the art. In an embodiment, a bridge substrate 380 may be embedded in the package substrate 105. In an embodiment, the bridge substrate 380 may be a silicon bridge or a bridge made of any other substrate material that is suitable for forming bridges. In an embodiment, routing layers 307 and vias 308 may electrically couple first pads 310 and second pads 312 over the package substrate 305 to the bridge substrate 380 and other components and/or circuitry in the electronic package 300.

In an embodiment, a solder resist layer 330 may be formed over the package substrate 305. The solder resist layer 330 may comprise a plurality of solder resist openings 331-332 that expose the first pads 310 and second pads 312, respectively. In an embodiment, the first pads 310 may have a tighter pitch and a smaller dimension than the second pads 312. As such, in this embodiment, the solder resist openings 331 over the first pads 310 may also have a smaller diameter (or a tighter pitch and a smaller dimension) than the solder resist openings 332 over the second pads 312.

In some embodiments, as shown in FIG. 3A, the conductive materials 316 and 314 are formed of copper that has been over plated (or over deposited) so that the conductive materials 316 and 314 are protruding over a first dielectric 306. In an embodiment, the conductive materials 316 and 314 (e.g., Cu, Al, Au, Ni, Ag, or the like) may be over deposited above the SROs 332 and the first dielectric 306 to form the over-plated conductive layer/material. The conductive materials 316 and 314 may be deposited using any suitable method, for example, a sputtering process, an evaporation process, a printing process (e.g., a 3D printing process), a jetting process, an electroplating process, or the like. In some embodiments, the dielectric 306 may be a polymer material such as, for example, polyimide, epoxy, or build-up film (BF).

Figure 3B:
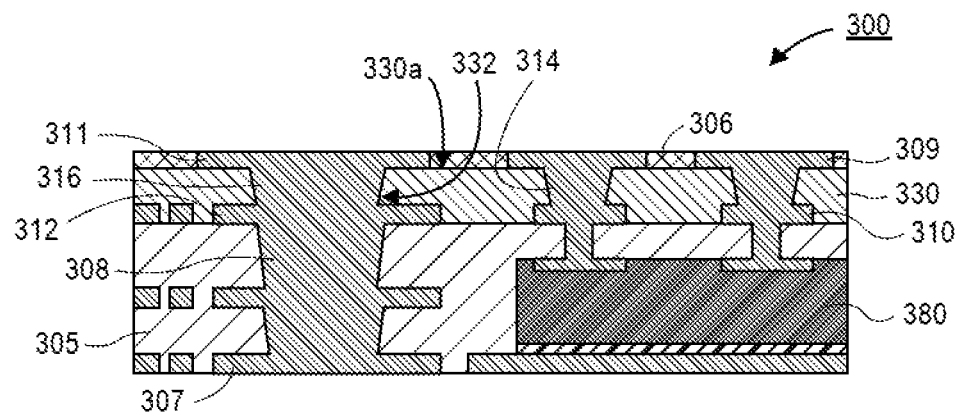

Referring now to FIG. 3B, a cross-sectional illustration of an electronic package 300 is shown after the over-plated conductive materials 316 and 314 are planarized, in accordance with an embodiment. In an embodiment, the conductive materials 316 and 314 are planarized/removed to form the respective conductive pads 311 and 309 by using, for example, a polishing process. The polishing process illustrated in FIG. 3B ensures that the over-plated conductive materials 316 and 314 is removed, but also ensures that the conductive pad 311 in the large SRO and the conductive pad 309 in the small SRO are level thus reducing the thickness variations. In some examples, the polishing process also planarizes/removes a portion of the DFR 306. Such planarized surfaces may be formed by grinding, chemical mechanical polishing (CMP), or another known technique.

Figure 3C:
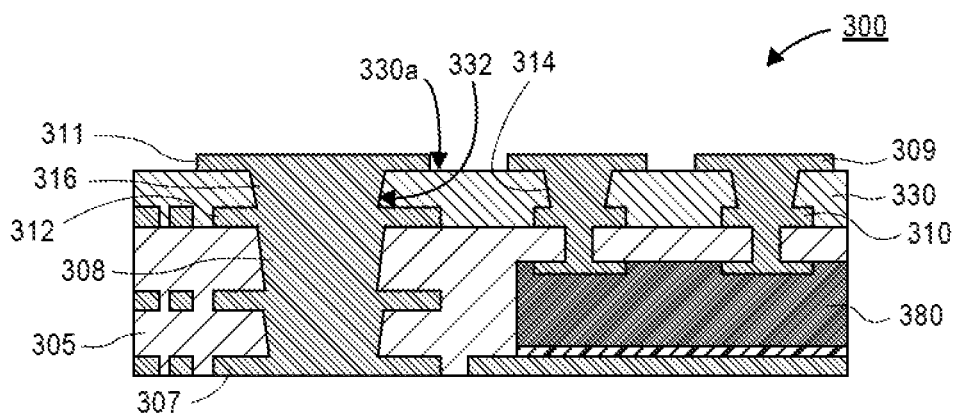

Referring now to FIG. 3C, a cross-sectional illustration of an electronic package 300 with the exposed conductive pads 311 and 309 is shown, in accordance with an embodiment. In an embodiment, the electronic package 300 removes the DFR 306 to expose the top surface 330a of the SR layer 330 and thus exposing the conductive pads 311 and 309. As shown in FIG. 3C, the top surfaces of both the smaller and larger conductive pads 309 and 311, respectively, have substantially the same thicknesses as measured from the top surface 330a of the SR layer 330 to the top surfaces of the conductive pads 309 and 311.

Figure 3D:
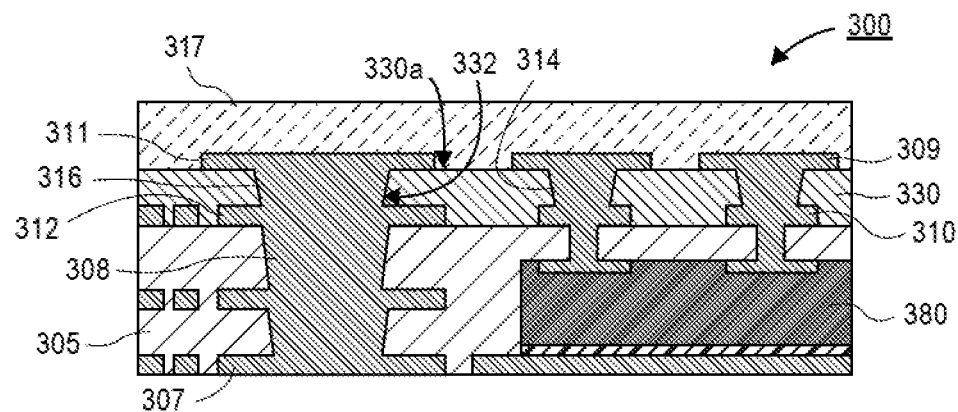

Referring now to FIG. 3D, a cross-sectional illustration of an electronic package 300 with a second dielectric 317 is shown, in accordance with an embodiment. In an embodiment, the electronic package 300 includes disposing the second dielectric over the top surface 330a of the SR layer 330 and the conductive pads 311 and 309. For one embodiment, the second dielectric 317 is similar to the first dielectric 306 of FIG. 3A.

Figure 3E:
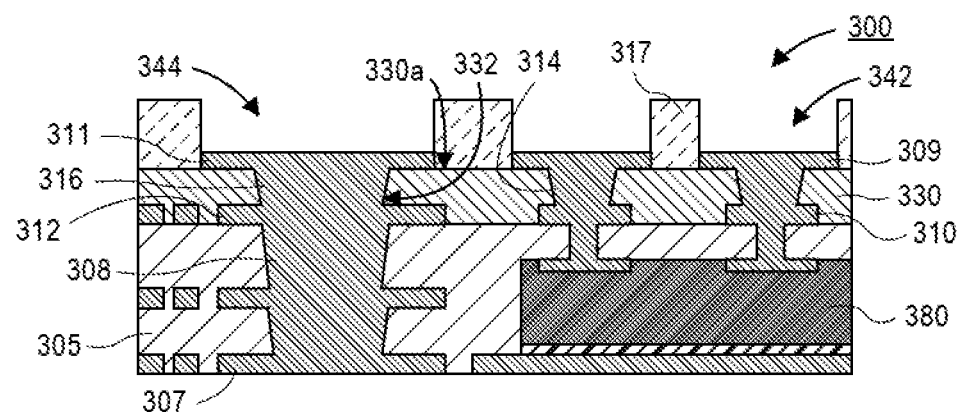

Referring now to FIG. 3E, a cross-sectional illustration of an electronic package 300 with one or more opening 344 and 342 is shown, in accordance with an embodiment. According to an embodiment, the patterning of the second dielectric 317 may be implemented with a lithographic process (e.g., exposing the second dielectric 317 with a radiation source through a mask and developed with a developer) to pattern the one or more openings 344 and 342 through the second dielectric 317 and thus expose the top surfaces of the conductive pads 311 and 309, respectively.

In some embodiments, the one or more openings 344 and 342 are patterned through the second dielectric layer 317 to define the subsequent solder bumps as shown below in FIGS. 3G-3H. According to one embodiment, the second dielectric layer 317 may be patterned to provide the openings 344 and 342 for the subsequent formation of a first conductive layer (i.e., the Sn plating layer).

Figure 3F:
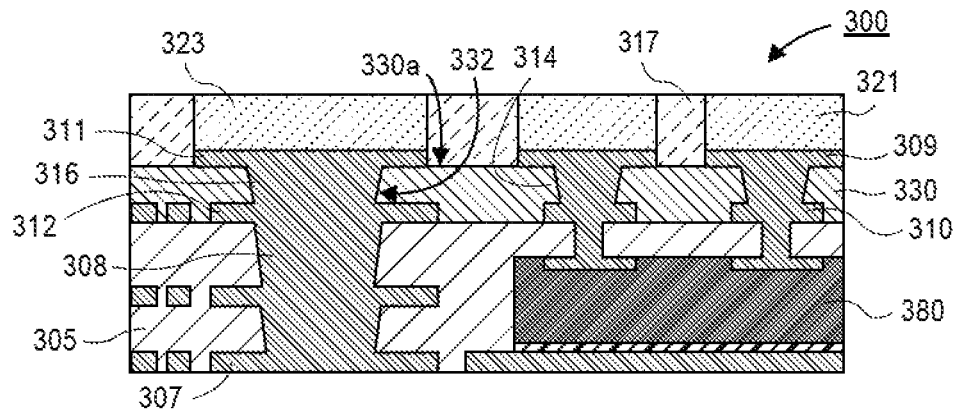

Referring now to FIG. 3F, a cross-sectional illustration of an electronic package 300 with conductive materials 323 and 321 is shown, in one embodiment. For one embodiment, the conductive materials 323 and 321 are disposed over the openings 344 and 342 and the conductive pads 311 and 309, respectively. As described above, the conductive materials 323 and 321 may be formed with a Sn plating that may be implemented as a SAP process, where the Sn plating is conformal since there is no via/SRO filling involved. Note that, in one embodiment, the second dielectric openings 344 and 342 are filled with the conductive materials 323 and 321, where a top surface of the conductive materials 323 and 321 is substantially coplanar with a top surface of the second dielectric layer 317.

Figure 3G:
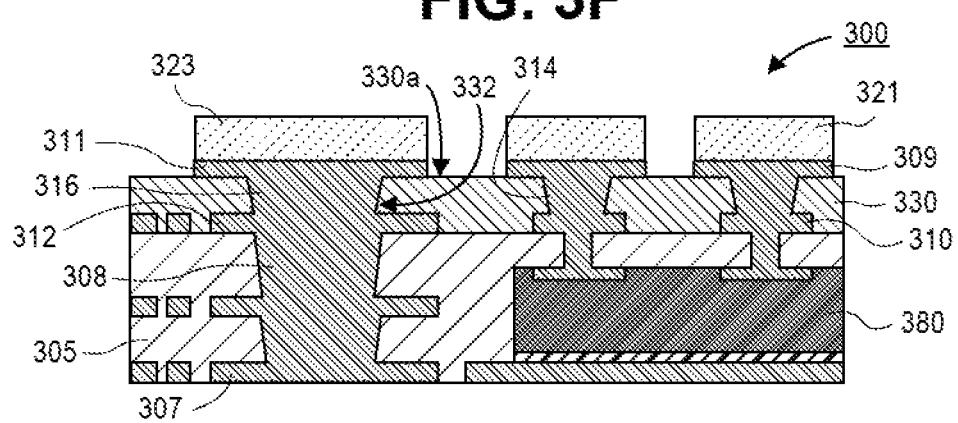

Referring now to FIG. 3G, a cross-sectional illustration of an electronic package 300 is shown after the second dielectric layer 317 has been removed/stripped to expose the conductive materials 323 and 321 on the respective pads 311 and 309, in accordance with an embodiment. As described above, the conductive materials 323 and 321 may then be implemented with a Sn planarization step.

Figure 3H:
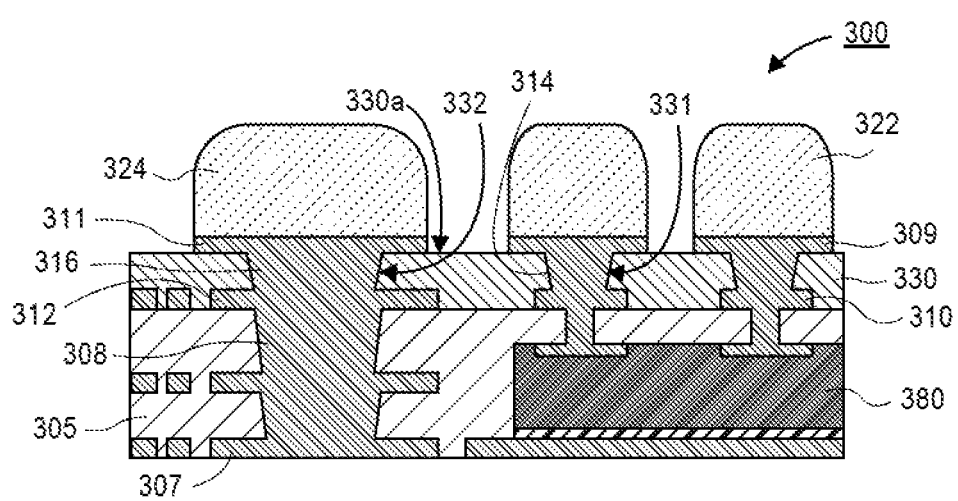

Lastly, referring now to FIG. 3H, a cross-sectional illustration of an electronic package 300 with solder bumps 324 and 322 is shown, according to one embodiment. In one embodiment, the conductive materials 323 and 321 may go through a reflow process, where additional conductive material may be added, to then form the respective solder bumps 324 and 322. That is, additional conductive material (i.e., Sn plating) may be disposed on the top surfaces of the conductive materials 323 and 321 after stripping the last dielectric (as shown in FIG. 3G) and polishing the top surfaces of the conductive materials 324 and 322.

Accordingly, as shown in FIG. 3H, the top surfaces of the solder bumps 324 may be substantially coplanar with the top surfaces of the solder bumps 322. For example, the solder bumps 322 formed over tightly spaced first pads 310 and the solder bumps 324 formed over larger second pads 312 have a substantially low difference in the solder bump height between such configurations. Since the underlying conductive material 314 and 316 has a uniform thickness (i.e., the top surfaces of the conductive material 314 and 316 may be substantially coplanar with a top surface 330a of the solder resist layer 330), the subsequently deposited solder bumps 322 and 324 has a low BTV. As such, in one embodiment, the BTV between the first solder bumps 322 and the second solder bumps 324 may be approximately less than 10 um. In other embodiments, the BTV between the first solder bumps 322 and the second solder bumps 324 may be approximately less than 7 um. Additionally, for other embodiments, the BTV between the first solder bumps 322 and the second solder bumps 324 may be approximately less than 7 um.

FIGS. 4A-4F are a series of cross-sectional illustrations that depict a process using a self-aligned via (SAV) process to provide solder bumps with low BTV, in accordance with an embodiment. As described above, FIGS. 4A-4F illustrate one of the approaches that enable overcoming the lack of via filling Sn chemistries to form solder bumps while maintaining a low rBTV. In some embodiments, the electronic package 400 of FIGS. 4A-4F may be substantially similar to the electronic packages 200 and 300 of FIGS. 2-3, with the exception that the electronic package 400 may be implemented with two stacked dielectrics 406 and 417 (e.g., unlike the process flow in FIG. 3 where the first dielectric has to be removed initially).

Figure 4A:
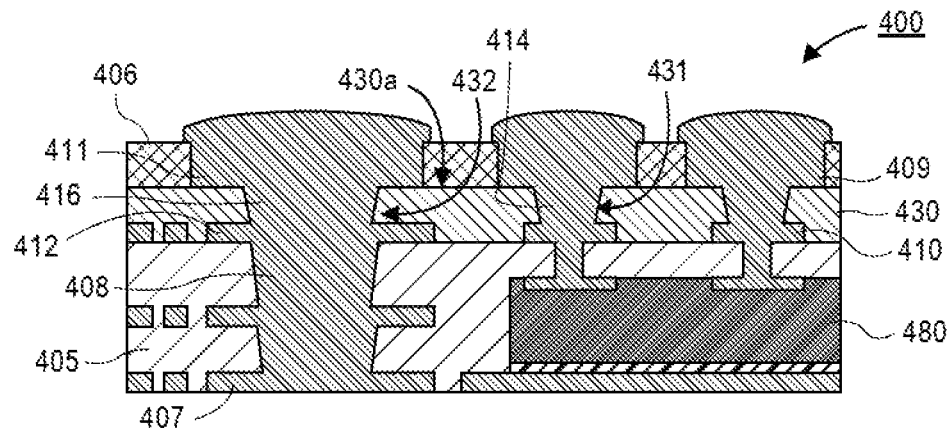
FIGS. 4A-4F are a series of cross-sectional illustrations that depict a process using a self-aligned via (SAV) process to provide solder bumps with low BTV, in accordance with an embodiment.

Referring now to FIG. 4A, a cross-sectional illustration of an electronic package 400 with over-plated conductive materials 416 and 414 is shown, in accordance with an embodiment. In one embodiment, the electronic package 400 may include a package substrate 405. The package substrate 405 may comprise alternating layers of organic build-up layers and conductive (e.g., copper) routing layers 407 and vias 408, as is known in the art. In an embodiment, a bridge substrate 480 may be embedded in the package substrate 405. In an embodiment, the bridge substrate 480 may be a silicon bridge or a bridge made of any other substrate material that is suitable for forming bridges. In an embodiment, routing layers 407 and vias 408 may electrically couple first pads 410 and second pads 412 over the package substrate 405 to the bridge substrate 480 and other components and/or circuitry in the electronic package 400.

In an embodiment, a solder resist layer 430 may be formed over the package substrate 405. The solder resist layer 430 may comprise a plurality of solder resist openings 431-432 that expose the first pads 410 and second pads 412, respectively. In an embodiment, the first pads 410 may have a tighter pitch and a smaller dimension than the second pads 412. As such, in this embodiment, the solder resist openings 431 over the first pads 410 may also have a smaller diameter (or a tighter pitch and a smaller dimension) than the solder resist openings 432 over the second pads 412.

In some embodiments, as shown in FIG. 4A, the conductive materials 416 and 414 are formed of copper that has been over plated (or over deposited) so that the conductive materials 416 and 414 are protruding over a first dielectric 406. In an embodiment, the conductive materials 416 and 414 (e.g., Cu, Al, Au, Ni, Ag, or the like) may be over deposited above the SROs 432 and the first dielectric 406 to form the over-plated conductive layer/material.

Figure 4B:
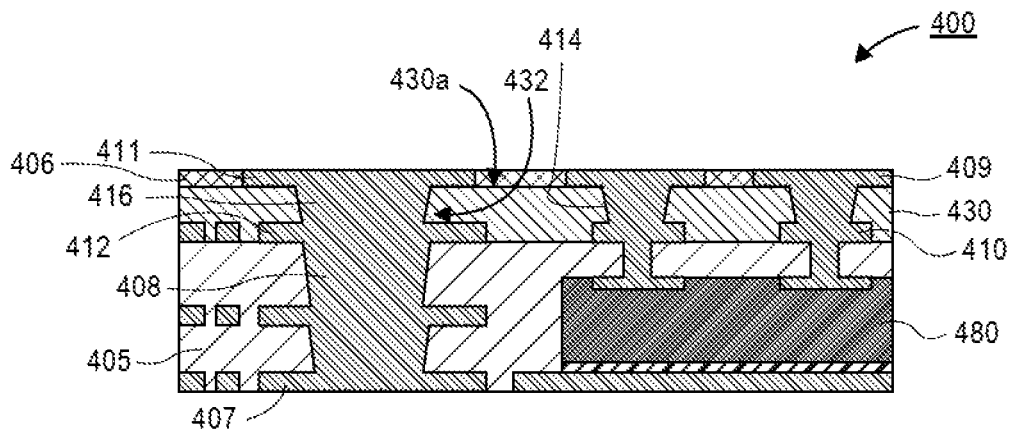

Referring now to FIG. 4B, a cross-sectional illustration of an electronic package 400 is shown after the over-plated conductive materials 416 and 414 are planarized, in accordance with an embodiment. In an embodiment, the conductive materials 416 and 414 are planarized/removed to form the respective conductive pads 411 and 409 by using, for example, a polishing process. The polishing process illustrated in FIG. 4B ensures that the over-plated conductive materials 416 and 414 is removed, but also ensures that the conductive pad 411 in the large SRO and the conductive pad 409 in the small SRO are level thus reducing the thickness variations. In some examples, the polishing process also planarizes/removes a portion of the first dielectric 406. Such planarized surfaces may be formed by grinding, chemical mechanical polishing (CMP), or another known technique.

Figure 4C:
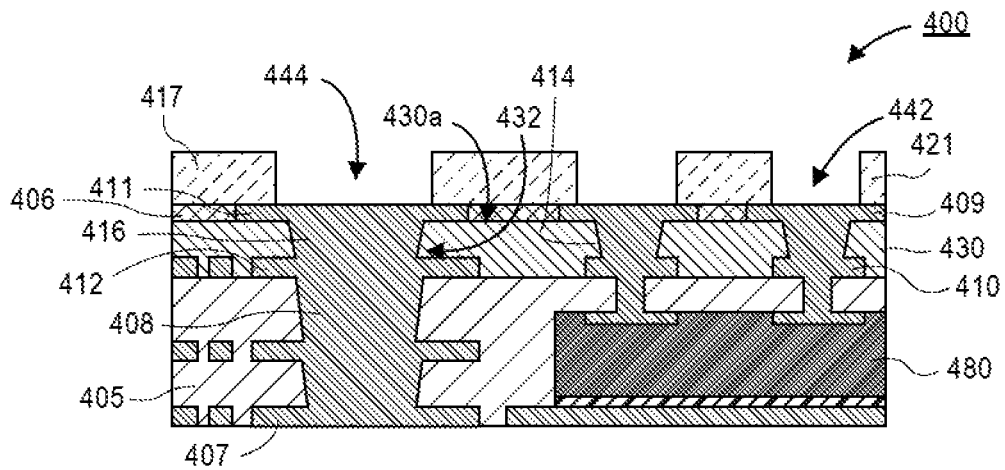

Referring now to FIG. 4C, a cross-sectional illustration of an electronic package 400 with a second dielectric 417 over the first dielectric 406 is shown, in accordance with an embodiment. In one embodiment, both the dielectrics 417 and 406 are patterned to form the openings 444 and 442 which expose the top surfaces of the respective conductive pads 411 and 409. Note that, as compared to FIG. 3E, the openings 444 and 442 may have a length (or a reduced diameter) that is less than the length of the respective conductive pads 411 and 409.

Figure 4D:
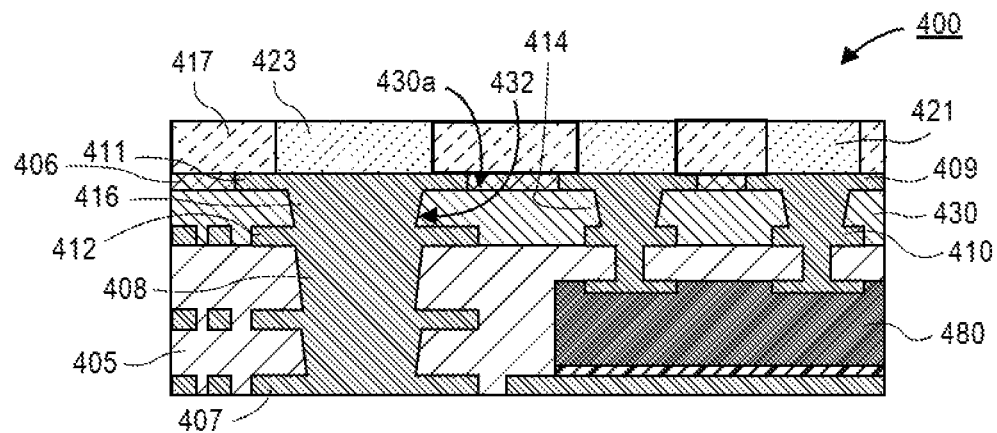

Referring now to FIG. 4D, a cross-sectional illustration of an electronic package 400 with conductive materials 423 and 421 is shown, in one embodiment. For one embodiment, the conductive materials 423 and 421 (e.g., a Sn plating) are disposed over the openings 444 and 442 and the conductive pads 411 and 409, respectively. As described above, the conductive materials 423 and 421 may be formed with a Sn plating that may be implemented with a SAP process, where the Sn plating is conformal since there is no via/SRO filling involved.

Figure 4E:
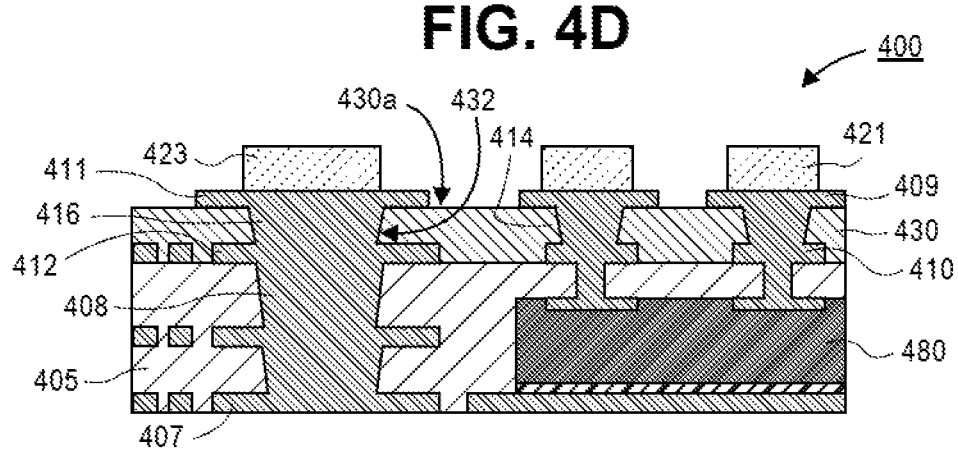

Referring now to FIG. 4E, a cross-sectional illustration of an electronic package 400 is shown after the both dielectric layers 417 and 406 have been removed/stripped to expose the conductive materials 423 and 421 on the respective pads 411 and 409, in accordance with an embodiment. As described above, the conductive materials 423 and 421 may then be implemented with a Sn planarization step.

Figure 4F:
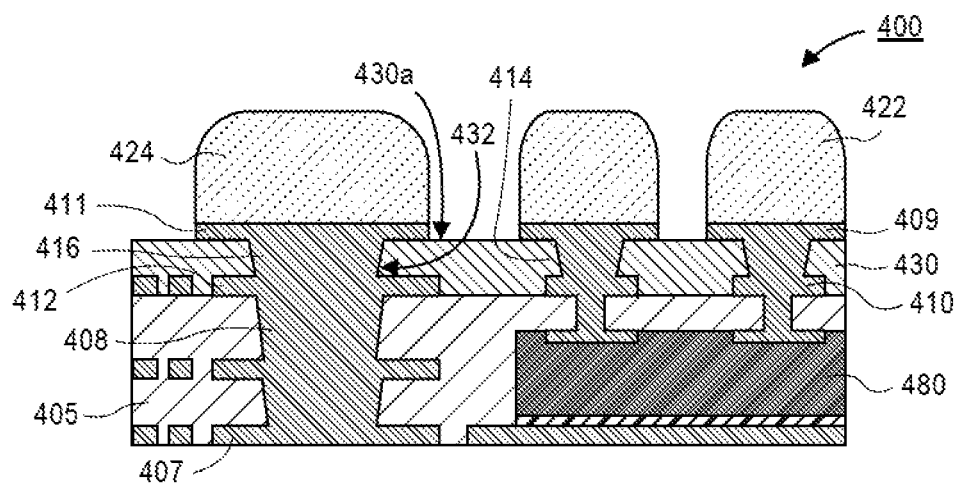

Lastly, referring now to FIG. 4F, a cross-sectional illustration of an electronic package 400 with solder bumps 424 and 422 is shown, according to one embodiment. In one embodiment, the conductive materials 423 and 421 may go through a reflow process, where additional conductive material may be added, to then form the respective solder bumps 424 and 422. That is, additional conductive material (i.e., Sn plating) may be disposed on the top surfaces of the conductive materials 423 and 421 after stripping the last dielectric (as shown in FIG. 4E) and polishing the top surfaces of the conductive materials 424 and 422.

Accordingly, as shown in FIG. 4F, the top surfaces of the solder bumps 424 may be substantially coplanar with the top surfaces of the solder bumps 422. For example, the solder bumps 422 formed over tightly spaced first pads 410 and the solder bumps 424 formed over larger second pads 412 have a substantially low difference in the solder bump height between such configurations. Since the underlying conductive material 414 and 416 has a uniform thickness (i.e., the top surfaces of the conductive material 414 and 416 may be substantially coplanar with a top surface 430a of the solder resist layer 430), the subsequently deposited solder bumps 422 and 424 has a low BTV. As such, in one embodiment, the BTV between the first solder bumps 422 and the second solder bumps 424 may be approximately less than 10 um. In other embodiments, the BTV between the first solder bumps 422 and the second solder bumps 424 may be approximately less than 7 um. Additionally, for other embodiments, the BTV between the first solder bumps 422 and the second solder bumps 424 may be approximately less than 7 um.

FIGS. 5A-5F are a series of cross-sectional illustrations that depict a process using lithographically defined vias to provide solder bumps with low BTV, in accordance with an embodiment. FIGS. 5A-5F illustrate an alternative approach using a LiV process to meet low rBTV while avoiding a need for Sn fill chemistry by using a litho via Sn bump plating on a litho via solder resist (SR) layer. For example, as illustrated below, FIGS. 5A-5F show that an SR pillar may be formed by a LiV process instead of using a SR via that may be formed by a laser drilling process. As such, in the embodiments of FIGS. 5A-5F, the SR may be disposed/laminated on the top of the pillars followed by the pillars being revealed using planarization, and accordingly a litho via Sn bump may be plated on the top of the revealed SR pillar layer using the same processes as described above.

In some embodiments, the electronic package 500 of FIGS. 5A-5F may be similar to the electronic packages 200, 300, and 400 of FIGS. 2-4, with the exception that the electronic package 500 may be implemented with a multi-die package patch, a surface finish, and a litho via Sn bump plating on a LiV SR layer (as described above).

Figure 5A:
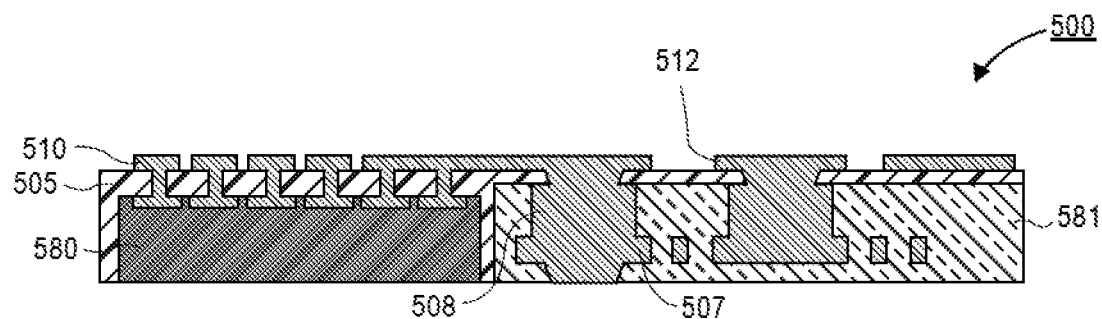
FIGS. 5A-5F are a series of cross-sectional illustrations that depict a process using lithographically defined vias to provide solder bumps with low BTV, in accordance with an embodiment.

Referring now to FIG. 5A, a cross-sectional illustration of an electronic package 500 is shown after a conductive layer has been polished and a dielectric has been removed, in accordance with an embodiment. In one embodiment, the electronic package 500 may include a package substrate 505. The package substrate 505 may comprise alternating layers of organic build-up layers and conductive (e.g., copper) routing layers 507 and vias 508, as is known in the art. In an embodiment, a bridge substrate 580 may be embedded in the package substrate 505. In an embodiment, the bridge substrate 580 may be a silicon bridge or a bridge made of any other substrate material that is suitable for forming bridges. Additionally, in this embodiment, a die 581 may also be embedded in the package substrate 505 and disposed adjacent to the bridge 580. In an embodiment, routing layers 507 and vias 508 may electrically couple first pads 510 and second pads 512 over the package substrate 505 to the bridge substrate 580, the die 581, and other components and/or circuitry in the electronic package 500. Also note that the conductive layer that includes the first and second pads 510 and 512 have been implemented with a planarization process as described herein.

Figure 5B:
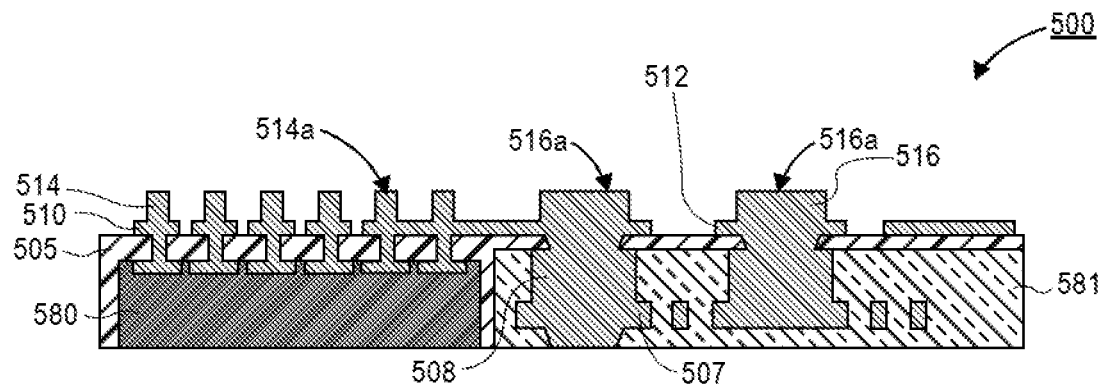

Referring now to FIG. 5B, a cross-sectional illustration of an electronic package 500 with conductive materials 514 and 516 is shown, in accordance with an embodiment. In an embodiment, the conductive materials 516 and 514 may be disposed on the respective pads 512 and 510 to form pillars, and subsequently the pillars 516 and 514 may be planarized by using, for example, a polishing process.

Figure 5C:
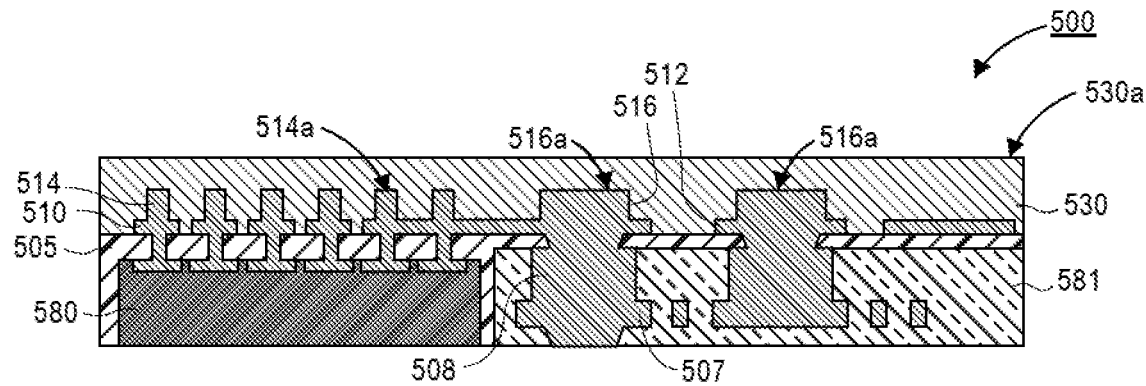

Referring now to FIG. 5C, a cross-sectional illustration of an electronic package 500 with a solder resist layer 530 is shown, in accordance with an embodiment. In one embodiment, the solder resist layer 530 may be formed over the pads 510 and 512, the pillars 514 and 516, and the package substrate 505.

Figure 5D:
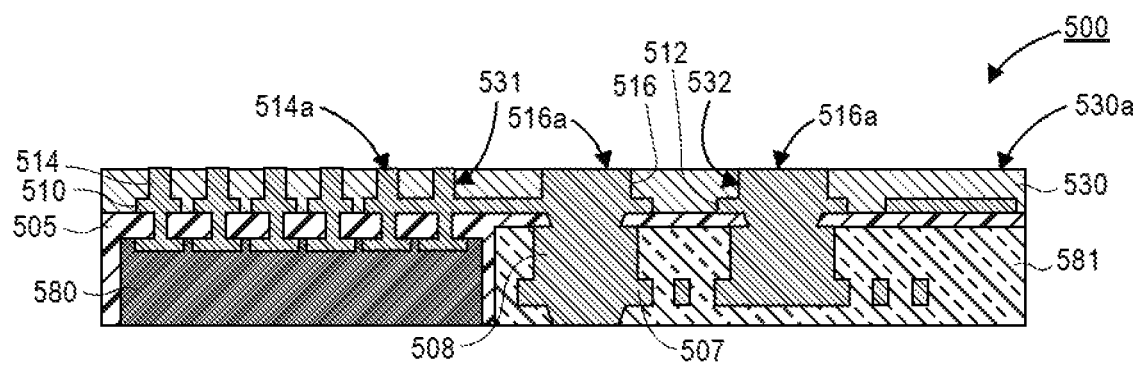

Referring now to FIG. 5D, a cross-sectional illustration of an electronic package 500 with exposed top surfaces 514a and 516a of the pillars 514 and the 516 is shown, in accordance with an embodiment. In one embodiment, portions of the solder resist layer 530 may be removed to expose the top surfaces 514a and 516a of the pillars 514 and the 516, respectively. In some embodiments, as shown in FIG. 5D, the top surfaces 514a and 516a of the pillars 514 and the 516 may be substantially coplanar with a top surface 530a of the solder resist layer 530. Also note that the electronic package 500 may comprise a plurality of solder resist openings 531-532 over the first pads 510 and second pads 512, respectively. In an embodiment, the first pads 510 may have a tighter pitch and a smaller dimension than the second pads 512. As such, in this embodiment, the solder resist openings 531 over the first pads 510 may also have a smaller diameter (or a tighter pitch and a smaller dimension) than the solder resist openings 532 over the second pads 512.

Figure 5E:
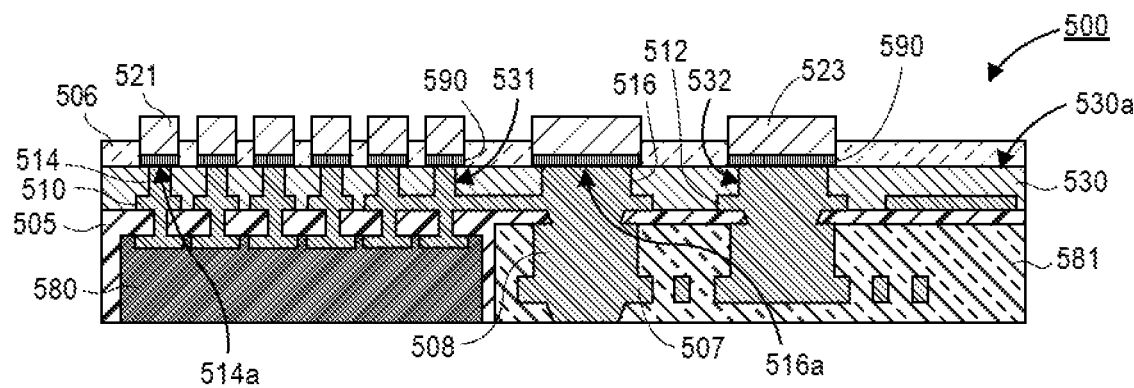

Referring now to FIG. 5E, a cross-sectional illustration of an electronic package 500 with conductive materials 523 and 521, a surface finish layer 590, and a dielectric 506 is shown, in one embodiment. For one embodiment, the conductive materials 523 and 521 (e.g., a litho Sn bump plating) are disposed over the dielectric 506 and the surface finish layer 590 (e.g., a NiPAu surface finish/coating), where the surface finish layer 590 may be disposed over the dielectric 506 and above the exposed top surfaces 514a and 516a of the pillars 514 and the 516, respectively. As described above, the conductive materials 523 and 521 may be formed with a Sn plating that may be implemented with a SAP process, where the Sn plating is conformal since there is no via/SRO filling involved. In addition, in one embodiment, the surface finish layer 590 may include one or more conductively materials, such as a NiPAu surface finish/coating. Note that, in an alternative embodiment, the surface finish layer may be omitted based on the desired packaging design/application.

Figure 5F:
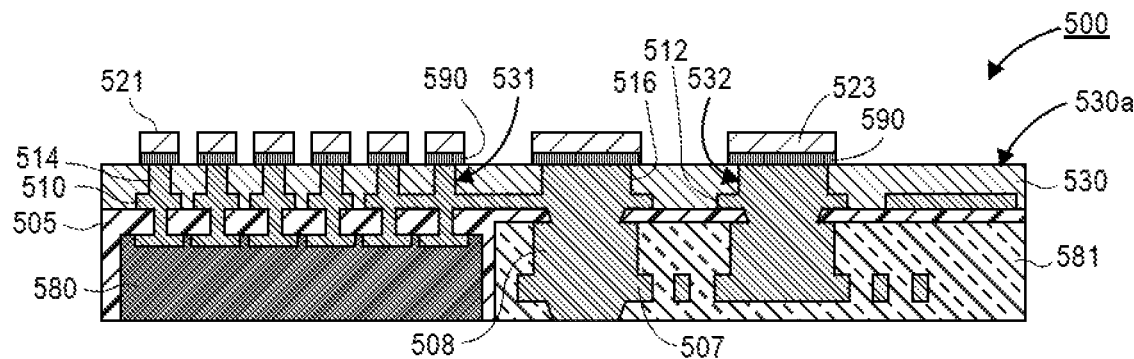

Lastly, referring now to FIG. 5F, a cross-sectional illustration of an electronic package 500 is shown after the dielectric was removed, according to one embodiment. In one embodiment, after the dielectric 506 is removed, the top surfaces of the conductive material 521 (i.e., a conductive plated bump) may be substantially coplanar with the top surfaces of the conductive material 523 (i.e., a conductive plated bump) as shown in FIG. 5F. For example, the conductive material 521 formed over tightly spaced first pads 510 and conductive material 523 formed over larger second pads 512 have a substantially low difference in the bump height between such configurations. Since the underlying conductive material 514 and 516 has a uniform thickness (i.e., the top surfaces of the conductive material 514 and 516 may be substantially coplanar with a top surface 530a of the solder resist layer 530), the subsequently deposited bumps 521 and 523 have a low BTV. As such, in one embodiment, the BTV between the conductive material 521 and the conductive material 523 may be approximately less than 10 um. In other embodiments, the BTV between the conductive material 521 and the conductive material 523 may be approximately less than 7 um. Additionally, for other embodiments, the BTV between the conductive material 521 and the conductive material 523 may be approximately less than 7 um.

FIGS. 6A-6H are a series of cross-sectional illustrations that depict a process using a conformal tin fill to provide solder bumps with low BTV, in accordance with an embodiment. In some embodiments, the electronic package 600 of FIGS. 6A-6H may be similar to the electronic packages 200, 300, 400, and 500 of FIGS. 2-5. In addition, the process of FIGS. 6A-6H is substantially similar to the packages of FIGS. 2-5 and illustrate an approach that overcomes the need for Sn filling chemistry by enabling a process flow that will enable conformal Sn fill. For example, the process of FIGS. 6A-6H may omit copper fill and/or planarization steps which may result in much lower costs. Accordingly, the process flow of FIGS. 6A-6H may enable a conformal process that may result in increased uniformity of bump height (or low rBTV) and accordingly much higher TCB yield at bump pitches of, for example, approximately 40 um or lower.

Referring now to FIG. 6, a cross-sectional illustration of an electronic package 600 with first and second pads 610 and 612 on a top surface 605a of a substrate 605 is shown, in accordance with an embodiment. In one embodiment, the electronic package 600 may include the package substrate 605. The package substrate 605 may comprise alternating layers of organic build-up layers and conductive (e.g., copper) routing layers 607 and vias 608, as is known in the art. In an embodiment, a bridge substrate 680 may be embedded in the package substrate 605. In an embodiment, the bridge substrate 680 may be a silicon bridge or a bridge made of any other substrate material that is suitable for forming bridges. In an embodiment, routing layers 607 and vias 608 may electrically couple the first pads 610 and second pads 612 over the package substrate 605 to the bridge substrate 680 and other components and/or circuitry in the electronic package 600.

Figure 6A:
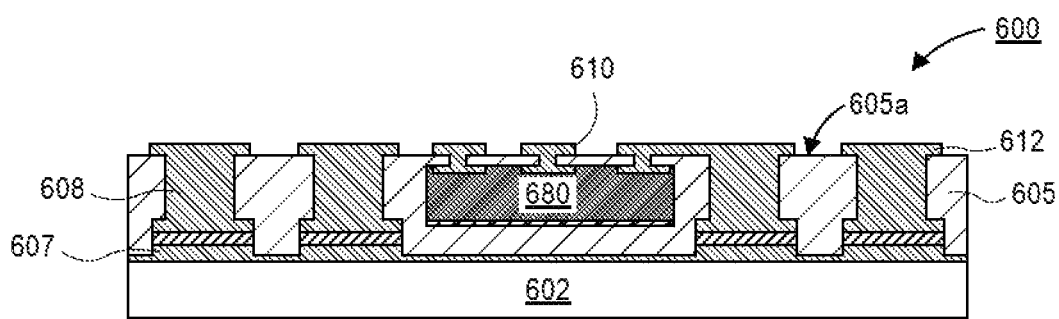
FIGS. 6A-6H are a series of cross-sectional illustrations that depict a process using a conformal tin fill to provide solder bumps with low BTV, in accordance with an embodiment.
Figure 6B:
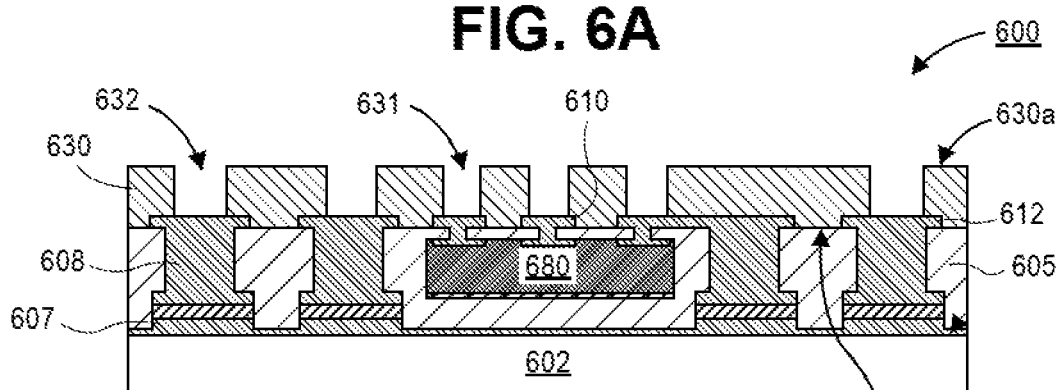

Referring now to FIG. 6B, a cross-sectional illustration of an electronic package 600 with a solder resist layer 630 is shown, in accordance with an embodiment. In one embodiment, the solder resist layer 630 may be patterned over the top surface 605a of the substrate 605 to form the openings 631 over the first pads 610 and the openings 632 over the second pads 612. Accordingly, the solder resist layer 630 may have a plurality of solder resist openings 631-632 that expose the first pads 610 and second pads 612, respectively. In an embodiment, the first pads 610 may have a tighter pitch and a smaller dimension than the second pads 612. As such, in this embodiment, the solder resist openings 631 over the first pads 610 may also have a smaller diameter (or a tighter pitch and a smaller dimension) than the solder resist openings 632 over the second pads 612.

Figure 6C:
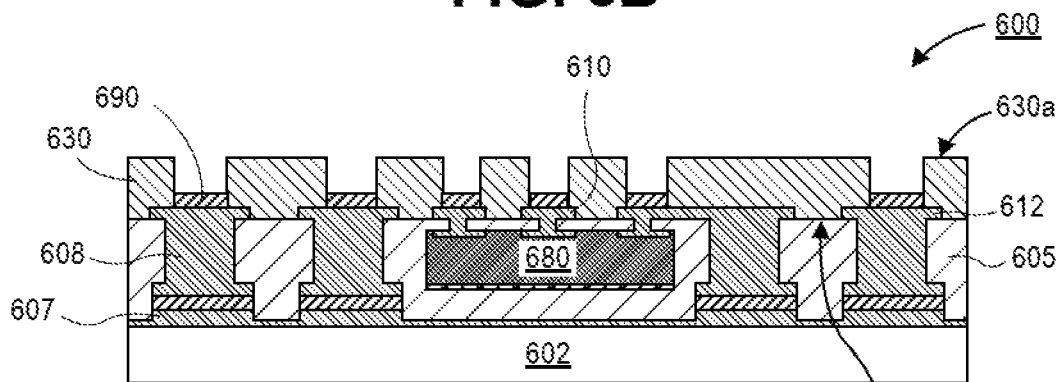
Figure 6D:
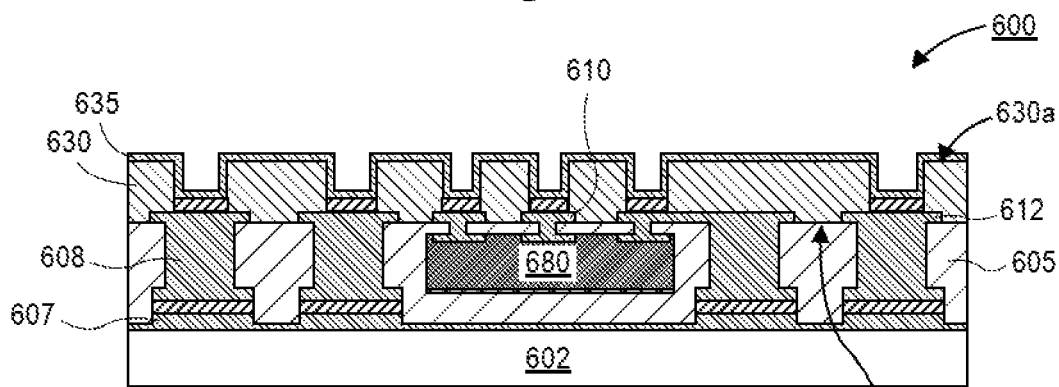

Referring now to FIG. 6C, a cross-sectional illustration of an electronic package 600 with a surface finish 690 is shown. In one embodiment, the surface finish 690 (e.g., a NiPAu surface finish) may be similar to the surface finish 590 of FIG. 5F. As shown in FIG. 6C, the surface finish 690 may formed in the openings 631-632 and on the top surfaces of the first and second pads 610 and 612, respectively. Additionally, as shown in FIG. 6D, a seed layer 635 (e.g., a Cu seed layer) may be disposed over the top surface 630a of the solder resist layer 630 (note that this includes the sidewalls of the solder resist openings) and the top surfaces of the surface finish 690, according to an embodiment. In one embodiment, the seed layer 635 may be formed with any known litho plating techniques, such as electroless plating/sputtering.

Figure 6E:
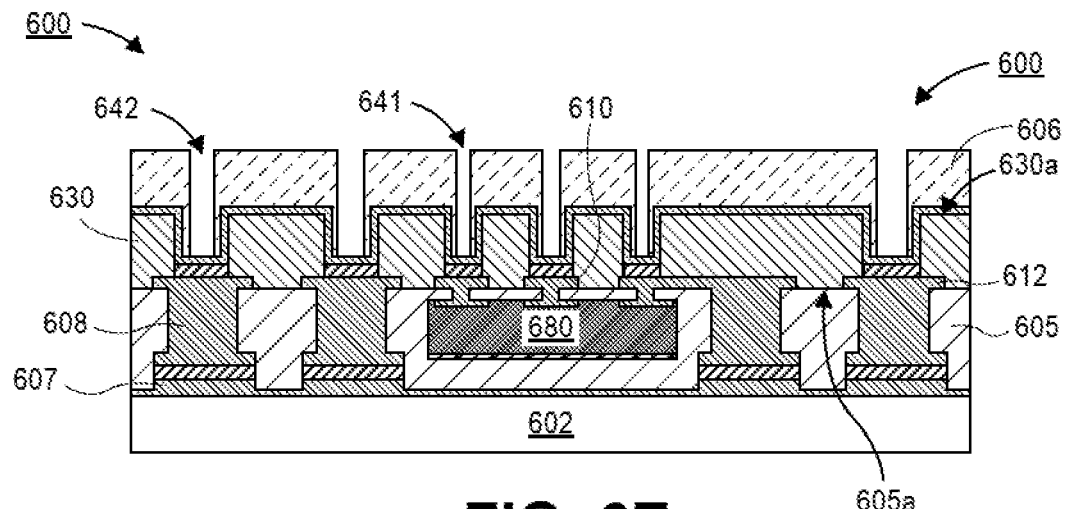

Referring now to FIG. 6E, a cross-sectional illustration of an electronic package 600 with a dielectric 606 is shown, in accordance with an embodiment. In one embodiment, the dielectric 606 may be patterned over the top surface 630a of the solder resist layer 630 to form the openings 641 over the first pads 610 and the openings 642 over the second pads 612. Accordingly, the dielectric 606 may have a plurality of solder resist openings 641-642 that expose the top surfaces of the seed layer 635 disposed over first pads 610 and second pads 612, respectively. Note that the openings 641-642 of the dielectric 606 may cover the sidewalls of the solder resist layer 630 that are covered with the seed layer 635 (as shown in the enlarged, detailed illustration of FIG. 6F).

Figure 6F:
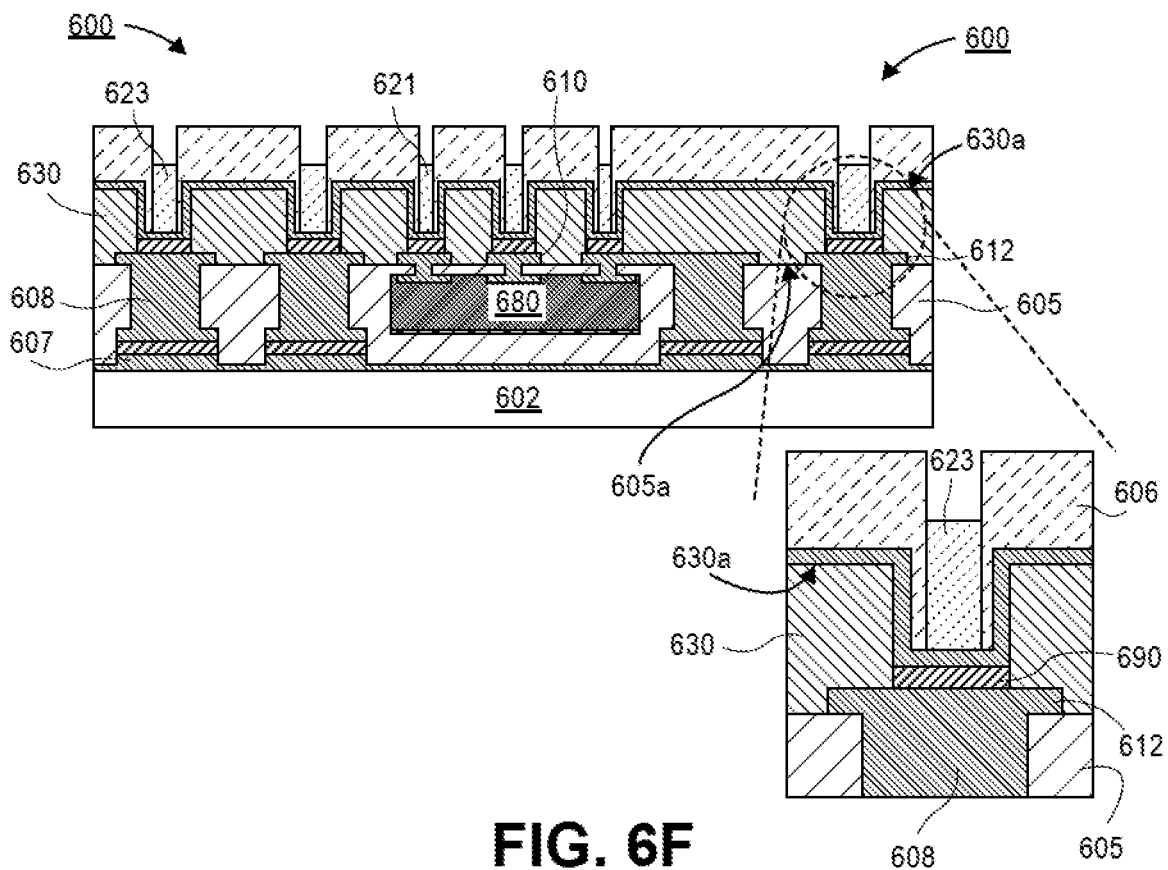

Referring now to FIG. 6F, a cross-sectional illustration of an electronic package 600 with conductive materials 623 and 621 is shown, according to an embodiment. In one embodiment, the conductive materials 621 and 623 (e.g., litho Sn bumps) are disposed into the respective openings 641-642 of the dielectric 606 and formed over the exposed top surfaces of the seed layer 635. As described above, the conductive materials 623 and 621 may be formed with a Sn plating that may be implemented with a SAP process, where the Sn plating is conformal since there is no via/SRO filling involved.

Figure 6G:
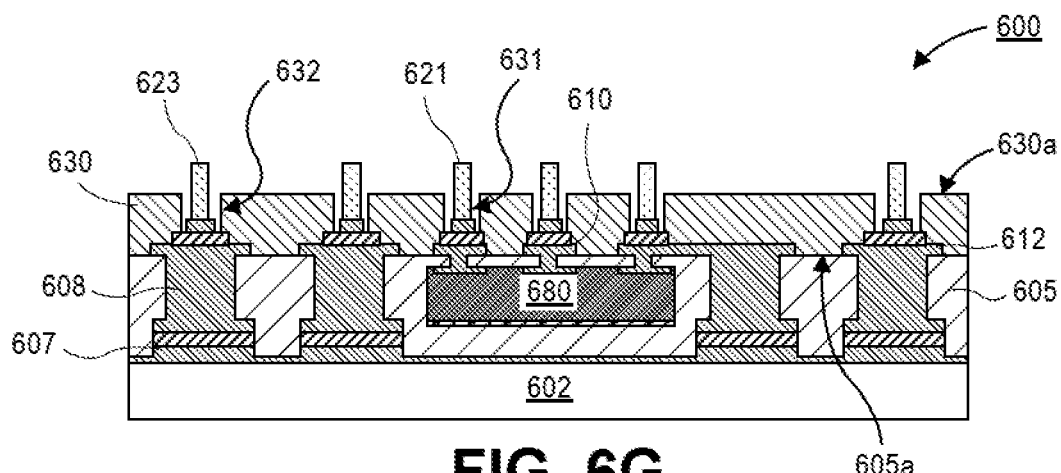

Referring now to FIG. 6G, a cross-sectional illustration of an electronic package 600 is shown after the dielectric and exposed seed layer was removed, according to one embodiment. In one embodiment, after the dielectric 606 is removed, the top surfaces of the conductive material 621 (i.e., a conductive plated bump) may be substantially coplanar with the top surfaces of the conductive material 623 (i.e., a conductive plated bump) as shown in FIG. 6F. For example, the conductive material 621 formed over tightly spaced first pads 610 and conductive material 623 formed over larger second pads 612 have a substantially low difference in the bump height between such configurations.

Figure 6H:
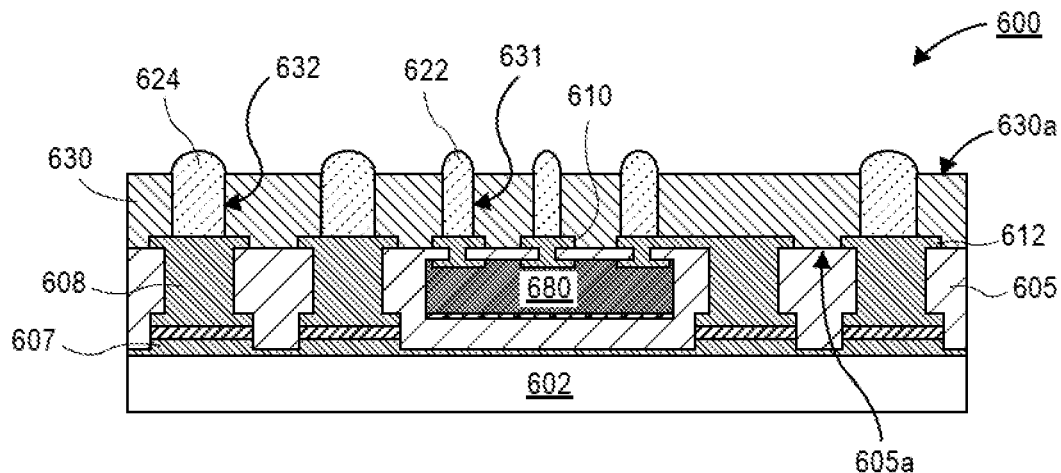

Referring now to FIG. 6H, a cross-sectional illustration of an electronic package 600 with solder bumps 624 and 622 is shown, according to one embodiment. In one embodiment, the conductive materials 623 and 621 may go through a reflow process, where additional conductive material may be added, to then form the respective solder bumps 624 and 622. That is, additional conductive material (i.e., Sn plating) may be disposed on the top surfaces of the conductive materials 623 and 621 after stripping the last dielectric and remaining seed layer (as shown in FIG. 6G).

Accordingly, as shown in FIG. 6H, the top surfaces of the solder bumps 624 may be substantially coplanar with the top surfaces of the solder bumps 622. For example, the solder bumps 622 formed over tightly spaced first pads 610 and the solder bumps 624 formed over larger second pads 612 have a substantially low difference in the solder bump height between such configurations. Since the underlying conductive material 621 and 623 had a uniform thickness (e.g., as shown in FIG. 6G), the subsequently deposited bumps 622 and 624 have a low BTV. As such, in one embodiment, the BTV between the first solder bumps 622 and the second solder bumps 624 may be approximately less than 10 um. In other embodiments, the BTV between the first solder bumps 622 and the second solder bumps 624 may be approximately less than 7 um. Additionally, for other embodiments, the BTV between the first solder bumps 622 and the second solder bumps 624 may be approximately less than 7 um.

Figure 7:
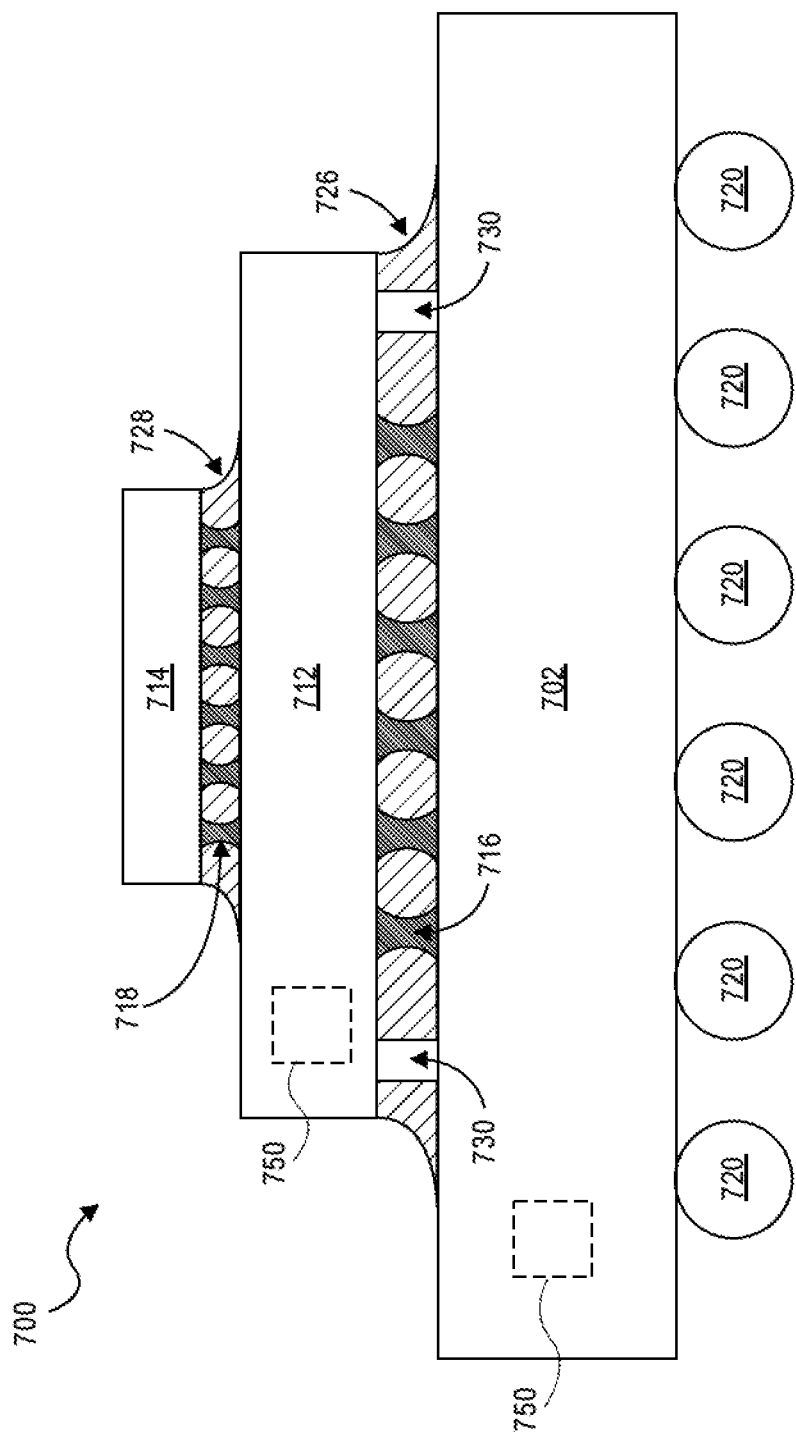
FIG. 7 is a cross-sectional illustration of an electronic package that includes solder bumps with low BTV formed in accordance with embodiments described herein.

FIG. 7 illustrates a semiconductor package 700 including a die 714, a substrate 712 (or an interposer), interconnect structures (e.g., the plurality of bumps disposed below the die 714 and the substrate 712), and the package substrate 702, where the substrate 712 and/or the package substrate 702 may have one or more electronic packages with uniform solder thicknesses over mixed bump pitch architectures, according to some embodiments.

For one embodiment, the semiconductor package 700 may implement the substrate 712 and/or the package substrate 702 to include an electronic package/device 750 with uniform solder thicknesses over mixed bump pitch architectures, according to one embodiment. For one embodiment, the electronic package(s) 750 of the substrate 712 and/or the package substrate 702 may be similar to the electronic packages of FIGS. 2-6. Note that the semiconductor package 700 is not limited to the illustrated semiconductor packaged system, and thus may be designed/formed with fewer, alternate, or additional packaging components and/or with different interconnecting structures. In some embodiments, the electronic package(s) 750 may be implemented to dispose Sn conformal/uniform solder thicknesses over mixed bump pitch architectures. Note that, in some embodiments, the package substrate 702 and/or the substrate 712 may be similar to the package substrates illustrated in FIGS. 2-6.

According to one embodiment, the semiconductor package 700 is merely one example of an embodiment of a semiconductor packaged system. For one embodiment, the semiconductor package 700 may include a land grid array (LGA) package and/or a pin grid array (PGA) package. For one embodiment, a die 714 (or an integrated circuit die) is coupled to a substrate 712 (e.g., an interposer) via one or more bumps/joints formed from respective microbumps. As described above, a solder joint formed by soldering of a microbump according to an embodiment may itself be referred to as a "bump" and/or a "microbump." Additionally, for other embodiments, the die 714, the substrate 712, and the package substrate 702 may be coupled using anisotropic conductive film (ACF). For one embodiment, the substrate 712 may be, but is not limited to, a silicon interposer and/or a die with through silicon vias (TSVs). For an alternate embodiment, the semiconductor package 700 may omit the interposer/substrate 712.

For some embodiments, the semiconductor package 700 may have the die 714 disposed on the interposer 712, where both the stacked die 714 and interposer 712 are disposed on a package substrate 702. According to some embodiments, the package substrate 702 may include, but is not limited to, a package, a substrate, a PCB, and a motherboard. For one embodiment, the package substrate 702 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer can be a photosensitive dielectric layer. For some embodiments, holes may be drilled in the PCB 702. For one embodiment, the PCB 702 may also include conductive layers that comprise copper lines/traces, metallic pads, vias, via pads, planes, and/or holes.

For one embodiment, the die 714 may include, but is not limited to, a semiconductor die, an electronic device (e.g., a wireless device), an integrated circuit, a CPU, a microprocessor, a platform controller hub (PCH), a memory, and a FPGA. The die 714 may be formed from a material such as silicon and have circuitry thereon that is to be coupled to the interposer 712. Although some embodiments are not limited in this regard, the package substrate 702 may in turn be coupled to another body, for example, a computer motherboard. One or more connections between the package substrate 702, the interposer 712, and the die 714—e.g., including some or all of bumps 716, 718, and 720—may include one or more interconnect structures and underfill layers 726 and 728. In some embodiments, these interconnect structures (or connections) may variously comprise an alloy of nickel, palladium, and tin (and, in some embodiments, Cu).

Connections between the package substrate 702 and another body may be made using any suitable structure, such as the illustrative bumps 720 shown. The package substrate 702 may include a variety of electronic structures formed thereon or therein. The interposer 712 may also include electronic structures formed thereon or therein, which may be used to couple the die 714 to the package substrate 702. For one embodiment, one or more different materials may be used for forming the package substrate 702 and the interposer 712. In certain embodiments, the package substrate 702 is an organic substrate made up of one or more layers of polymer base material, with conducting regions for transmitting signals. In certain embodiments, the interposer 712 is made up of a ceramic base material including metal regions for transmitting signals. Although some embodiments are not limited in this regard, the semiconductor package 700 may include gap control structures 730—e.g., positioned between the package substrate 702 and the interposer 712. Such gap control structures 730 may mitigate a change in the height of the gap between the package substrate 702 and the interposer 712, which otherwise might occur during reflowing while die 714 is attached to interposer 712. Note that the semiconductor package 700 includes an underfill material 728 between the interposer 712 and the die 714, and an underflow material 726 between the package substrate 702 and the interposer 712. For one embodiment, the underfill materials (or layers) 726 and 728 may be one or more polymers that are injected between the layers. For other embodiments, the underfill materials may be molded underfills (MUF).

Note that the semiconductor package 700 may include fewer or additional packaging components based on the desired packaging design.

Figure 8:
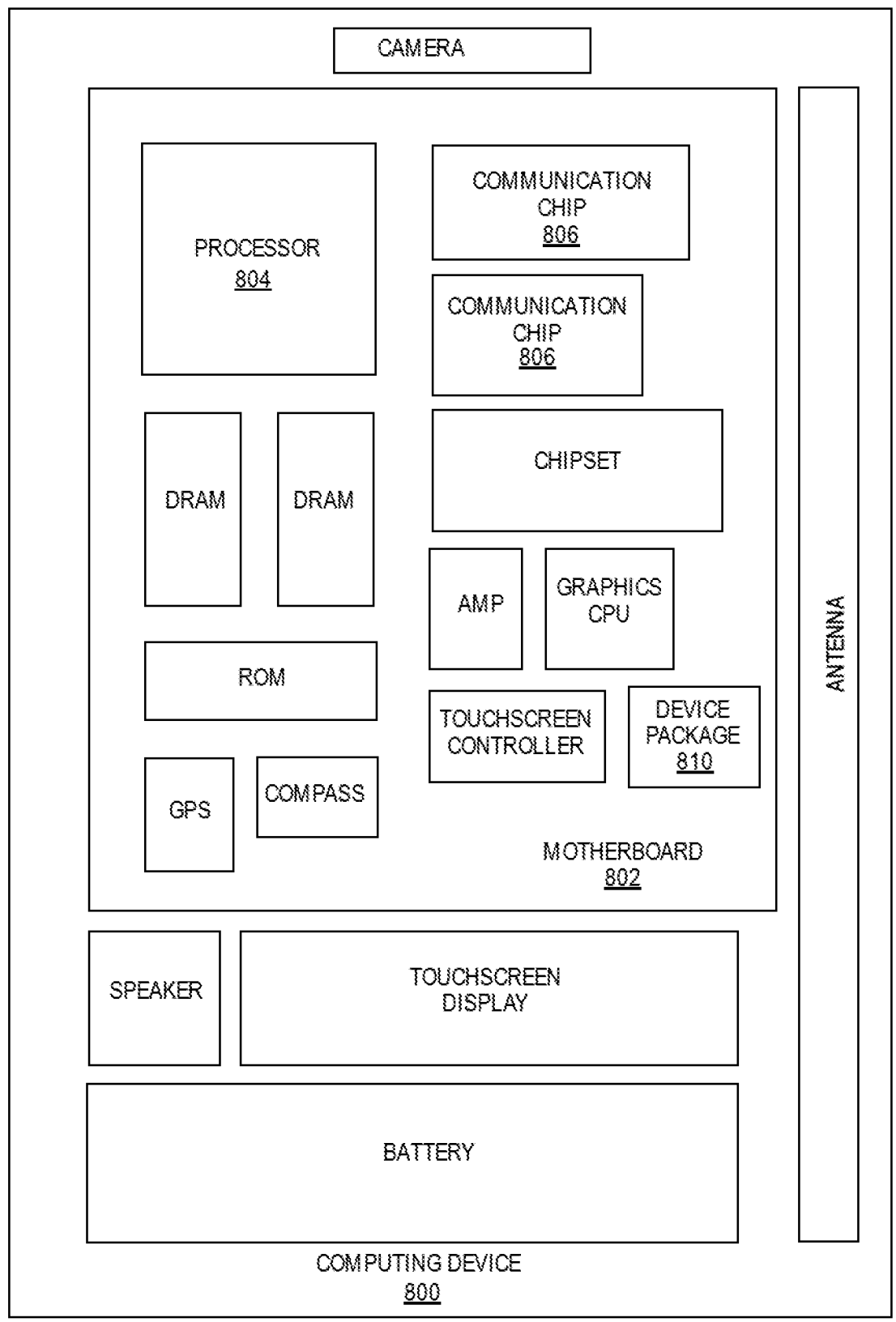
FIG. 8 is a schematic of a computing device built in accordance with an embodiment.

FIG. 8 illustrates a computing device 800 including a device package 810 with one or more electronic packages with uniform solder thicknesses over mixed bump pitch architectures, in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor may be packaged on a device package 810 that has uniform solder thicknesses over mixed bump pitch architectures, in accordance with embodiments described herein. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip may be packaged on a device package 810 that has uniform solder thicknesses over mixed bump pitch architectures, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1: an electronic package: a package substrate; first conductive pads formed over the package substrate, wherein the first conductive pads have a first surface area; second conductive pads over the package substrate, wherein the second conductive pads have a second surface area that is greater than the first surface area; a solder resist layer over the first conductive pads and the second conductive pads; a plurality of solder resist openings through the solder resist layer, wherein each of the solder resist openings expose one of the first conductive pads or the second conductive pads, wherein the solder resist openings are filled with conductive material, and wherein a top surface of the conductive material is substantially coplanar with a top surface of the solder resist layer; and solder bumps over the conductive material in the solder resist openings.

Example 2: the electronic package of Example 1, wherein the solder bumps have a low bump thickness variation (BTV).

Example 3: the electronic package of Example 1 or Example 2, wherein the BTV is less than 5 um.

Example 4: the electronic package of Examples 1-3, further comprising: a bridge substrate embedded in the package substrate.

Example 5: the electronic package of Examples 1-4, wherein the first conductive pads are formed above the bridge substrate.

Example 6: the electronic package of Examples 1-5, the conductive pads extend over a top surface of the solder resist.

Example 7: the electronic package of Examples 1-6, wherein the solder bumps are over the pads.

Example 8: the electronic package of Examples 1-7, wherein the conductive material through the solder resist is are lithographically defined columns.

Example 9: the electronic package of Examples 1-8, wherein the lithographically defined columns have substantially vertical sidewalls.

Example 10: the electronic package of Examples 1-9, wherein the solder resist openings have non-vertical sidewalls.

Example 11: the electronic package of Examples 1-10, wherein the solder resist openings are formed with an etching process.

Example 12: the electronic package of Examples 1-11, wherein the conductive material below the first conductive pads is lithographically defined, and wherein the conductive material below the second conductive pads is not lithographically defined.

Example 13: a method of forming an electronic package, comprising: embedding a bridge substrate in a packaging substrate; forming first vias to the bridge substrate; forming second vias to electrical routing in the packaging substrate; forming first conductive pads over the first vias, wherein the first conductive pads have a first surface area; and forming second conductive pads over the second vias, wherein the second conductive pads have a second surface area that is greater than the first surface area.

Example 14: the method of Example 13, wherein the first vias are lithographically defined vias.

Example 15: the method of Example 13 or Example 14, further comprising a solder resist layer around the first vias and the second vias.

Example 16: the method of Examples 13-15, wherein the first vias and the second vias are substantially coplanar with a top surface of the solder resist layer.

Example 17: the method of Examples 13-16, further comprising: plating a solder material over the first conductive pads and the second conductive pads.

Example 18: the method of Examples 13-17, further comprising: reflowing the solder material to form solder bumps.

Example 19: the method of Examples 13-18, wherein the solder bumps have a low bump thickness variation (BTV).

Example 20: the method of Examples 13-19, wherein the BTV is less than 5 um.

Example 21: the method of Examples 13-20, wherein the solder material is plated into openings formed in a dry film resist (DFR) layer.

Example 22: the method of Examples 13-21, further comprising: planarizing the solder material with a top surface of the DFR layer.

Example 23: an electronic package: a package substrate; a bridge substrate embedded in the package substrate; first conductive pads formed over the package substrate, wherein the first conductive pads have a first surface area, wherein the first conductive pads are above the bridge substrate; second conductive pads over the package substrate, wherein the second conductive pads have a second surface area that is greater than the first surface area; a solder resist layer over the first conductive pads and the second conductive pads; a plurality of solder resist openings through the solder resist layer, wherein each of the solder resist openings expose one of the first conductive pads or the second conductive pads, wherein the solder resist openings are filled with conductive material, and wherein a top surface of the conductive material is substantially coplanar with a top surface of the solder resist layer; and solder bumps over the conductive material in the solder resist openings.

Example 24: the electronic package of Example 23, wherein the conductive material below the first pads are lithographically defined.

Example 25: the electronic package of Example 23 or Example 24, wherein the solder bumps have a bump thickness variation (BTV) less than 5 um.

What is claimed is:

1. An electronic package:
    a package substrate;
    first conductive pads formed over the package substrate, wherein the first conductive pads have a first surface area;
    second conductive pads over the package substrate, wherein the second conductive pads have a second surface area that is greater than the first surface area;
    a solder resist layer over the first conductive pads and the second conductive pads;
    a plurality of solder resist openings through the solder resist layer, wherein each of the solder resist openings expose one of the first conductive pads or the second conductive pads, wherein the solder resist openings are filled with conductive material, and wherein a top surface of the conductive material is substantially coplanar with a top surface of the solder resist layer; and
    solder bumps over the conductive material in the solder resist openings.

2. The electronic package of claim 1, wherein the solder bumps have a low bump thickness variation (BTV).

3. The electronic package of claim 2, wherein the BTV is less than 5 um.

4. The electronic package of claim 1, further comprising:
    a bridge substrate embedded in the package substrate.

5. The electronic package of claim 4, wherein the first conductive pads are formed above the bridge substrate.

6. The electronic package of claim 1, the conductive pads extend over a top surface of the solder resist.

7. The electronic package of claim 6, wherein the solder bumps are over the pads.

8. The electronic package of claim 1, wherein the conductive material through the solder resist is are lithographically defined columns.

9. The electronic package of claim 8, wherein the lithographically defined columns have substantially vertical sidewalls.

10. The electronic package of claim 1, wherein the solder resist openings have non-vertical sidewalls.

11. The electronic package of claim 10, wherein the solder resist openings are formed with an etching process.

12. The electronic package of claim 1, wherein the conductive material below the first conductive pads is lithographically defined, and wherein the conductive material below the second conductive pads is not lithographically defined.

13. An electronic package:
    a package substrate;
    a bridge substrate embedded in the package substrate;
    first conductive pads formed over the package substrate, wherein the first conductive pads have a first surface area, wherein the first conductive pads are above the bridge substrate;
    second conductive pads over the package substrate, wherein the second conductive pads have a second surface area that is greater than the first surface area;
    a solder resist layer over the first conductive pads and the second conductive pads;
    a plurality of solder resist openings through the solder resist layer, wherein each of the solder resist openings expose one of the first conductive pads or the second conductive pads, wherein the solder resist openings are filled with conductive material, and wherein a top surface of the conductive material is substantially coplanar with a top surface of the solder resist layer; and
    solder bumps over the conductive material in the solder resist openings.

14. The electronic package of claim 13, wherein the conductive material below the first pads are lithographically defined.

15. The electronic package of claim 13, wherein the solder bumps have a bump thickness variation (BTV), and wherein the BTV is less than 5 um.

* * * * *